United States Patent [19]
Jiang et al.

[11] Patent Number: 5,936,929
[45] Date of Patent: Aug. 10, 1999

[54] OPTICAL SUBMODULE AND METHOD FOR MAKING

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 08/850,889

[22] Filed: May 2, 1997

[51] Int. Cl.$^6$ ............................................ G11B 7/12
[52] U.S. Cl. ................................ 369/112; 369/44.12
[58] Field of Search ................................ 369/112, 116, 369/121, 122, 44.12, 44.14, 44.37, 54; 385/88, 14, 89, 31

[56] References Cited

U.S. PATENT DOCUMENTS

| | | | |
|---|---|---|---|
| 5,608,716 | 3/1997 | Koyama et al. | 369/44.37 X |
| 5,625,617 | 4/1997 | Hopkins et al. | 369/44.12 X |
| 5,757,741 | 5/1998 | Jiang et al. | 369/44.12 |

*Primary Examiner*—Muhammad N. Edun
*Attorney, Agent, or Firm*—Eugene A. Parsons; William E. Koch

[57] ABSTRACT

An optical module that includes a multiple number of VCSELs, or VCSELs and conventional edge emitting lasers, is proposed to be incorporated into a DVD pickup to read either CD or DVD through a single optical system.

30 Claims, 2 Drawing Sheets

OPTICAL SUBMODULE AND METHOD FOR MAKING

FIELD OF THE INVENTION

The present invention pertains to optical pickup modules and more specifically to vertical cavity surface emitting laser based optical pickup modules.

BACKGROUND OF THE INVENTION

The rapid advancement of multimedia applications requires a system that stores more information more compactly, and is easier to use and handle, and possesses superior performance in every respect. The digital video disk (DVD) technology offers that advantage, and its application field extends from movie entertainment to computer data storage. In fact, the DVD has a tremendous role to play wherever digital technology rules—that is, everywhere big capacity is a must.

DVD is alternatively called digital versatile disk. It includes products and software that will be built in conformance with a specification being developed by a consortium of the largest computer, consumer electronics, and entertainment companies. The intention is to create a range of compatible products based on a new generation of the Compact Disk format which provides increased storage capacity and performance, especially for video and multimedia applications.

A compact disk (CD) can only store 5 minutes worth of analog image information, and a larger size laser disk of 11.8 inch can store 60 minutes of images. The movie and computer industries both want a small disc with CD compatibility, because the CD, which is the global standard for music and computer software, is increasingly packaged on CD ROMs. People are familiar with these convenient, space-saving disks. Also, both industries want a disk with enough single-side capacity to handle the general run of tasks. There has to be enough capacity for interruption-free movie viewing and for fast, reliable access and retrieval of computer data. The new DVD standard allows a single side DVD to hold 4.7 gigabytes of information, enough to store 135 minutes of high quality movie. The DVD also offers great advantages to users of computers.

As the industry introduces new digital technologies, an increasingly important consideration is compatibility with previous formats. Great effort has gone into making the DVD system, such as DVD-ROM, backward compatible. That means you will be able to play the existing CD format on a DVD system. However, there exist quite a few physical differences between a DVD system and a CD system. For instance, a DVD format disk has a pit length of 0.4 $\mu$m and a track pitch of 0.74 $\mu$m, almost half that of a CD format disk. In addition, the DVD substrate is 0.6 mm, in comparison to a CD substrate of 1.2 mm. The DVD laser wavelength is either 635 nm or 650 nm, and the DVD numerical aperture (NA) of the focal lens is 0.6, while the CD laser wavelength is 780 nm, and the CD NA of the focal lens is 0.45. These different parameters between DVD and CD lead to difference between a DVD pickup module and a CD pickup module.

Several approaches have been proposed to solve the DVD backward compatibility issue. Among the candidate solutions are an integrated two-lens switching system which consists of two lenses, one for CD, and the other for DVD, and a dual-focus pickup system in which a single lens is used to achieve focus for both CD and DVD. With the integrated two-lens switching system, two lenses, one for CD and the other for DVD, are switched by rotating the lenses horizontally to read signals for each disk. With the dual-focus pickup system, a single lens can achieve focus for both CD and DVD without being realigned, and can read the signals, due to the adoption of a hologram lens.

The two lens system and the hologram lens system are complicated and difficult to make. Another technique is to use an LCD shutter to alter the characteristics of the laser used in reading disks. The LCD shutter pickup is less complicated than the two-lens and hologram formats, resulting in a smaller, more reliable pickup. The pickup is built using a 635 nm red laser. The LCD shutter changes the numerical aperture of the lens, producing a narrower beam, resulting in a longer focal distance of 1.2 mm into CDs, or a wider beam, resulting in a shorter focal distance of 0.6 mm into DVDs. This allows reading the two different formats with one pickup.

Although the LCD shutter pickup is an improvement to either the two lens pickup system or the hologram lens pickup system, it is not an efficient use of the laser output power because the shutter blocks a significant amount of the laser power to narrow the beam width. Power efficiency is very important to laptop computer applications. Also, in the LCD shutter pickup system extra circuitry is required to control the LCD shutter.

Thus it is highly desirable and an object of the present invention to provide for a low cost, compact optical pickup module, that has included therein a vertical cavity surface emitting laser (VCSEL) of 780 nm and a visible edge emitting laser, or another visible VCSEL, which module utilizes low cost materials, and is simple to fabricate.

It is another purpose of the present invention to provide for a new and improved low cost optical pickup that can read both CD and DVD, and is energy efficient.

SUMMARY OF THE INVENTION

The above problems and others are at least partially solved and the above objects and others are realized in an optical submodule including a substrate having a first surface, a second surface, and a third surface. The second surface is connected to the first surface by the third surface so that the second surface is substantially parallel to the first surface and the third surface is positioned at an angle to the first surface. A first light emitting device is disposed on the second surface of the substrate for emitting a first light toward the third surface so as to allow the first light to be reflected off the third surface and a second light emitting device is operable disposed on the first surface of the substrate for emitting a second light substantially parallel to the first light.

DETAILED DESCRIPTION OF THE DRAWINGS

The optical pickup module of the present invention is based on the use of multiple semiconductor lasers, such as multiple vertical cavity surface emitting lasers (VCSELs), or a combination of VCSELs and conventional edge emitting semiconductor lasers to achieve appropriate beam spot size and focal distance to read both CDs and DVDs. Generally, the optical pickup module includes a VCSEL of 780 nm and an edge emitting laser of 650 nm or 635 nm mounted close to each other on a substrate. Alternatively, the edge emitting laser of the module is replaced by a VCSEL of 650 nm or 635 nm. The pickup module has only one lens system that is shared by both lasers. The lens system is controlled by an electrical servo system, and can therefore fine tune its relative position to each laser. When a CD needs to be read, the 780 nm VCSEL is switched on and the servo system tunes the lens to a position that focuses the laser beam into the CD substrate of 1.2 mm. When a DVD needs to be read, the 650 nm or 635 nm laser is switched on and the servo system adjusts the lens to a position that focuses the laser beam into the DVD substrate of 0.6 mm.

Figure 1:
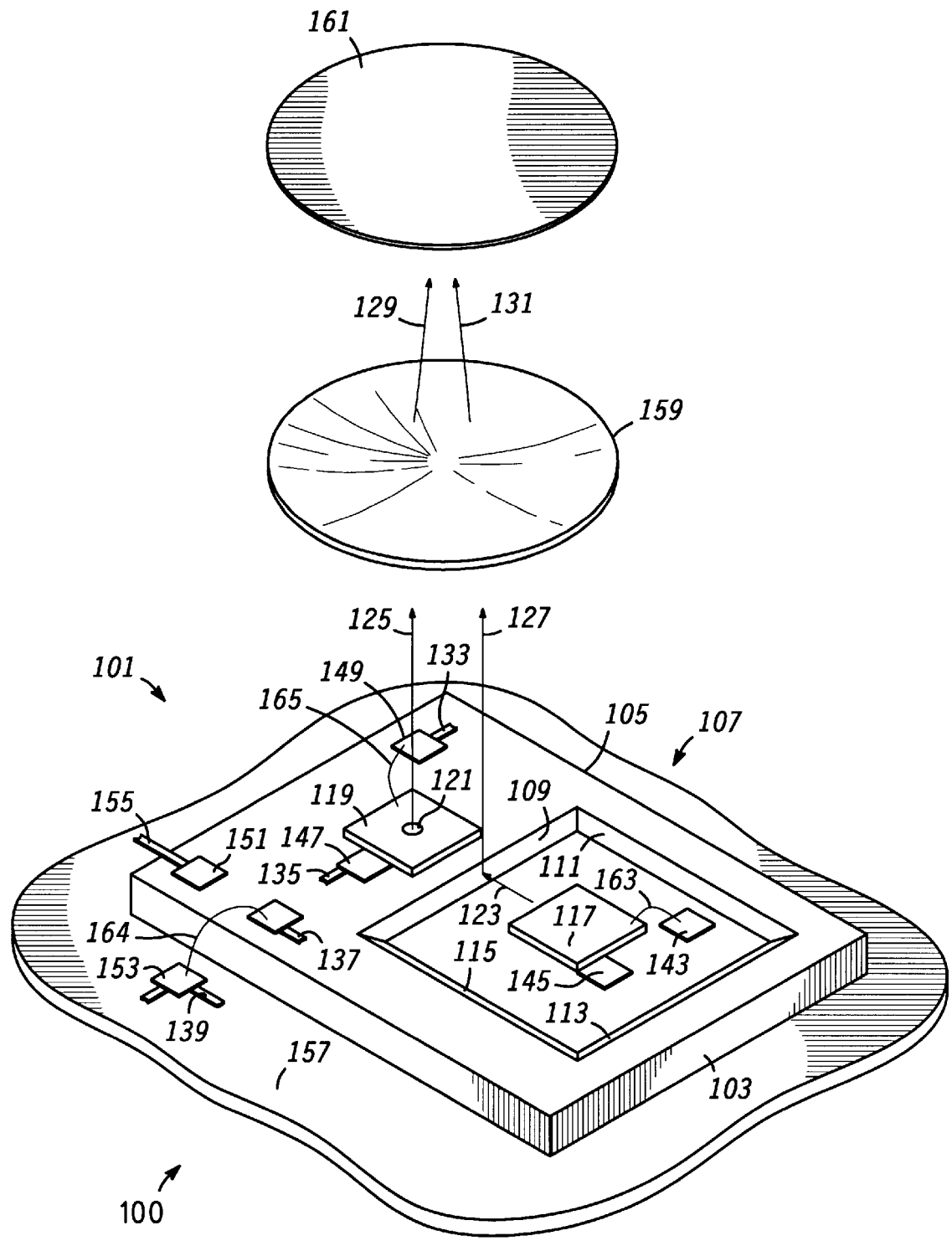
FIG. 1 is an isometric view of a simplified optical pickup module in accordance with the present invention.

Turning now to the drawings, attention is first directed to FIG. 1 which illustrates a first embodiment of the present invention. An optical module 100 consists of an optical submodule 101 and a lens system 159 controlled by an electric servo system (not shown). Submodule 101 has a substrate 103, made of any rigid material, such as a silicon substrate or molded plastic, and mounted on a rigid submount 157 such as steel, aluminum or molded plastics. Substrate 103 has a top surface 105, a hollow cavity consisting of a bottom surface 107, and side surfaces 109, 111, 113, and 115. Top surface 105 and bottom surface 107 are positioned generally parallel to each other and side surface 109 is oriented at an angle of 45° to bottom surface 107 and top surface 105. Electrical contact pads 143 and 145 are mounted on the bottom surface 107 and electrical contact pads 147 and 149 are mounted on top surface 105. All of contact pads 143, 145, 147 and 149 are electrically isolated from each other, and are connected to one or more electrical circuit boards, represented by numerals 151 and 153, through electrical transmission lines 133, 135, 137, 139 and 155. All of the contact pads and electrical transmission lines are made of gold, aluminum or any other metal by deposition, sputtering or plating. The electrical connection between the contact pads, the transmission lines and the circuit boards is achieved through wire bonding, soldering, leadframe plug-in, etc.

A laser device 117, such as an edge emitting laser diode which operates at a wavelength of 630 nm to 690 nm, is mounted on the bottom surface 107 directly in contact with pad 145 as one of the laser current bias contacts. The other laser contact of laser device 117 is connected to pad 143 through a wire bond 163. A laser beam 123 is emitted from laser device 117 parallel to surface 107, and is directed toward side surface 109. Laser beam 127 is reflected by side surface 109 in a direction normal to top surface 105.

A laser device 119, such as a vertical cavity surface emitting laser operating at a wavelength of 760–800 nm, is mounted on top surface 105 directly in contact with contact pad 147 adjacent to side surface 109. A second contact of laser device 119, typically the anode of laser device 119, is connected to contact pad 149 through wire bond 165. A laser beam 125 is emitted from an emission aperture 121 on laser device 119, and is directed perpendicular to the substrate top surface 105, or in parallel to laser beam 127. The distance between laser beams 125 and 127 is normally less than 150 $\mu$m, and typically less than 75 $\mu$m.

When the pickup system detects a disk 161 in place and determines that disk 161 is a CD, laser device 119 is turned on, and laser device 117 is turned off. Only beam 125 enters lens system 159, and the servo system adjust lens system 159 to an appropriate position, so that an output beam 129 is focused into disk 161, which is a CD with a substrate of 1.2 mm in thickness. When the pickup system determines that disk 161 is a DVD, laser device 119 is turned off, and laser device 117 is turned on. Only beam 127 enters lens system 159, and the servo system adjust lens system 159 to an appropriate position, so that an output beam 131 is focused into disk 161, which is a DVD with a substrate of 0.6 mm in thickness. The small distance of less than 150 $\mu$m between beams 125 and 127 ensures that both laser beams can share the same lens system 159 with only minimal lens position adjustment by the lens servo system.

It will be understood by those skilled in the art that a third laser device (not shown), such as a vertical cavity surface emitting laser operating at a wavelength different from that of laser devices 117 and 119, can be mounted on top surface 105, right next to laser device 119. For example, this third laser device could be a VCSEL having a wavelength of 650 nm or 635 nm, laser device 119 is a VCSEL having a wavelength of 780 nm, and laser device 117 is an edge emitting laser having a wavelength of 400 nm. It is expected that a future generation of DVD, DVD-II, will use a semiconductor laser operating at a wavelength of around 400 nm. Therefore, the optical module with the above three laser devices can be used to read CD, DVD, and DVD-II.

Figure 2:
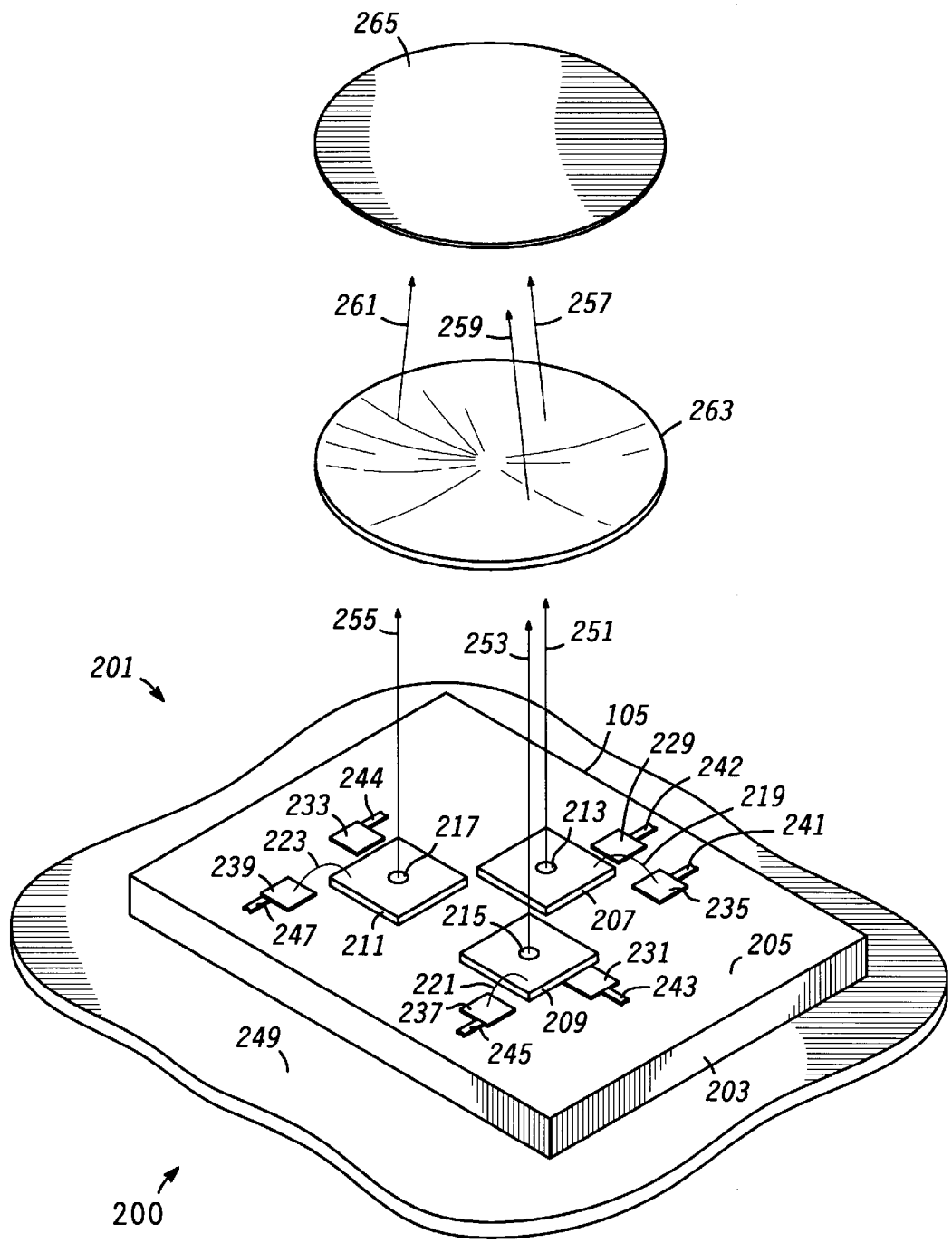
FIG. 2 is an isometric view of another simplified optical pickup module in accordance with the present invention.

Turning now to the drawings, attention is directed to FIG. 2 which illustrates a second embodiment of the present invention. An optical module 200 consists of an optical submodule 201 and a lens system 263 controlled by an electric servo system (not shown). Submodule 201 has a substrate 203, made of any rigid material, such as a silicon substrate or molded plastic, and mounted on a rigid submount 249 such as steel, aluminum or molded plastics. Substrate 203 has a top surface 205 with six electrical contact pads 229, 231, 233, 235, 237, and 239 mounted thereon and electrically isolated from each other. Contact pads 229, 231, 233, 235, 237, and 239 are connected to one or more electrical circuit boards (not shown) through electrical transmission lines 241, 242, 243, 244, 245, and 247. All the contact pads and electrical transmission lines are made of gold, aluminum or any other convenient metal by deposition, sputtering or plating. The electrical connections between contact pads, the transmission lines, and the circuit boards is achieved through wire bonding, soldering, leadframe plug-in, etc.

A first laser device 207 with an emission aperture 213, such as a VCSEL operating at a wavelength of 780 nm, is mounted directly in contact with pad 229 as one of the laser contacts. A second electrical contact of laser device 207 is connected to pad 235 through a wire bond 219. A laser beam 251 emitted from laser device 207 is perpendicular to surface 205, and is directed toward lens system 263. A second laser device 209 with an emission aperture 215, such as a VCSEL operating at a wavelength of 635 nm or 650 nm, is mounted directly in contact with contact pad 231 as one of the laser contacts. A second electrical contact of laser device 209 is connected to pad 237 through a wire bond 221. A laser beam 253 emitted from laser device 209 is perpendicular to surface 205, and is directed toward lens system 263. A third laser device 211 with an emission aperture 217, such as a VCSEL operating at a wavelength of 400 nm, is mounted directly in contact with pad 233 as one of the laser contacts. A second electrical contact of laser device 211 is connected to pad 239 through a wire bond 223. A laser beam 255 emitted from laser device 211 is perpendicular to surface 205, and is directed toward lens system 263. The three laser beams 251, 253, and 255 are parallel to each other and the distances between the beams are normally less than 150 $\mu$m, and typically less than 75 $\mu$m.

When the optical pickup system detects a disk 265 in place and determines that disk 265 is a CD, laser device 207 is turned on and laser devices 209 and 211 are turned off. Only beam 251 enters lens system 263, and the servo system adjusts lens system 263 to an appropriate position, so that output beam 257 is focused into disk 265, which is a CD with a substrate of 1.2 mm in thickness. When the optical pickup system determines that disk 265 is a DVD, laser devices 207 and 211 are turned off, and laser device 209 is turned on. Only beam 253 enters lens system 263, and the servo system adjusts lens system 263 to an appropriate position, so that output beam 259 is focused into disk 265, which is a DVD with a substrate of 0.6 mm in thickness. When the optical pickup system determines that disk 265 is a DVD-II, laser devices 207 and 209 are turned off, and laser device 211 is turned on. Only beam 255 enters lens system 263, and the servo system adjusts lens system 263 to an appropriate position, so that output beam 261 is focused into the disk 265. The small distances of less than 150 μm between beams 251, 253 and 255 ensure that all three laser beams can share the same lens system 263 with only minimal lens position adjustment by the lens servo system. It will be understood by those skilled in the art that with only two VCSELs, one at 780 nm and the other at 635 nm or 650 nm, the optical module can be used to read both CD and DVD.

Thus, a low cost, compact optical pickup module, has been described that includes therein a vertical cavity surface emitting laser (VCSEL) of 780 nm and a visible edge emitting laser, or another visible VCSEL, which module utilizes low cost materials, and is simple to fabricate. Further, the new and improved low cost optical pickup can read both CD and DVD, and is energy efficient.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. An optical submodule comprising:
   a substrate having a first surface, a second surface, and a third surface, the second surface being connected to the first surface by the third surface, the second surface is substantially parallel to the first surface and the third surface is positioned at an angle to the second surface;
   a first light emitting device disposed on the second surface of the substrate for emitting a first light toward the third surface so as to cause the first light to be reflected off the third surface; and
   a second light emitting device operable disposed on the first surface of the substrate for emitting a second light substantially parallel to the first light.

2. An optical submodule as claimed in claim 1 wherein the first light emitting device is an edge emitting laser.

3. An optical submodule as claimed in claim 1 wherein the second light emitting device is a vertical cavity surface emitting laser.

4. An optical submodule as claimed in claim 1 wherein the angle is in a range of forty degrees to fifty degrees.

5. An optical submodule as claimed in claim 4 wherein the angle is forty five degree.

6. An optical submodule as claimed in claim 1 wherein the substrate is made of silicon.

7. An optical submodule as claimed in claim 1 further including a reflective coating applied to the third surface.

8. An optical submodule as claimed in claim 7 wherein the coating is made of silver.

9. An optical submodule as claimed in claim 7 wherein the coating is made of gold.

10. An optical submodule as claimed in claim 7 wherein the coating is made of aluminum.

11. An optical submodule comprising:
    a substrate having a first surface, a second surface, and a third surface, the second surface being connected to the first surface by the third surfaceand the third surface being positioned at an angle to the second surface; and
    a first light emitting device designed for emitting a first light at a first wavelength and a second light emitting device designed for emitting a second light at a second wavelength disposed on the substrate, the first light emitting device being disposed on the second surface of the substrate for emitting a first light toward the third surface of the substrate so as to cause the first light to be reflected off the third surface into a first beam of light, the second light emitting device being disposed on the first surface of the substrate for emitting a second beam of light substantially parallel to the first beam of light, and the first beam of light and the second beam of light being spaced a distance apart.

12. An optical submodule as claimed in claim 11 wherein the first light emitting device is an edge emitting laser.

13. An optical submodule as claimed in claim 11 wherein the second light emitting device is a vertical cavity surface emitting laser.

14. An optical submodule as claimed in claim 11 wherein the angle is in a range of forty degrees to fifty five degrees.

15. An optical submodule as claimed in claim 14 wherein the angle is forty five degrees.

16. An optical submodule as claimed in claim 11 wherein the substrate is made of silicon.

17. An optical submodule as claimed in claim 11 further including a reflective coating applied to the third surface.

18. An optical submodule as claimed in claim 17 wherein the coating is made of silver.

19. An optical submodule as claimed in claim 17 wherein the coating is made of gold.

20. An optical submodule as claimed in claim 17 wherein the coating is made of aluminum.

21. An optical submodule as claimed in claim 11 wherein the distance apart is less than 150 micrometers.

22. An optical submodule as claimed in claim 21 wherein the distance apart is less than 75 micrometers.

23. An optical submodule as claimed in claim 11 wherein the first wavelength is in a range of 600 nanometers to 700 nanometers.

24. An optical submodule as claimed in claim 23 wherein the first wavelength is in a range of 625 nanometers to 675 nanometers.

25. An optical submodule comprising a substrate with a first light emitting device mounted on a first planar surface of the substrate and designed for emitting a first light at a first wavelength, a second light emitting device mounted on the first planar surface of the substrate and designed for emitting a second light at a second wavelength, and a third light emitting device mounted on the first planar surface of the substrate and designed for emitting a third light at a third wavelength the first light emitting device, the second light emitting device, and the third light emitting device being spaced a distance apart.

26. An optical submodule as claimed in claim 25 wherein the distance apart is less than 150 micrometers.

27. An optical submodule as claimed in claim 26 wherein the distance apart is less than 75 micrometers.

28. An optical submodule as claimed in claim 25 wherein the first wavelength is in a range of 600 nanometers to 700 nanometers.

29. An optical submodule as claimed in claim 28 wherein the first wavelength is in a range of 625 nanometers to 675 nanometers.

30. A method for making an optical submodule comprising the steps of:

providing a substrate having a first surface, a second surface, and a third surface, the second surface being connected to the first surface by the third surface with the second surface substantially parallel to the first surface and the third surface being positioned at an angle to the second surface;

positioning a first light emitting device on the second surface of the substrate for emitting a first light toward the third surface so as to cause the first light to be reflected off the third surface; and positioning a second light emitting device on the first surface of the substrate for emitting a second light substantially parallel to the first light.

\* \* \* \* \*